(12) United States Patent
Palinkas et al.

(10) Patent No.: US 6,510,034 B2
(45) Date of Patent: Jan. 21, 2003

(54) SPARK GAP DEVICE HAVING MULTIPLE NODES

(75) Inventors: Raymond Palinkas, Canastota, NY (US); Ahmet Burak Olcen, Syracuse, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 27 days.

(21) Appl. No.: 09/858,739

(22) Filed: May 16, 2001

(65) Prior Publication Data

US 2002/0171992 A1 Nov. 21, 2002

(51) Int. Cl.[7] .............................. H01C 7/12; H02M 1/00
(52) U.S. Cl. ........................... 361/119; 361/111
(58) Field of Search .............................. 361/86, 91, 111, 361/112, 118, 119, 120, 126, 129, 130

(56) References Cited

U.S. PATENT DOCUMENTS

| | | | |
|---|---|---|---|
| 3,492,534 A | 1/1970 | Szeremy et al. | |
| 4,160,210 A | 7/1979 | Molinari | |
| 4,701,725 A | 10/1987 | Dorsey | |
| 4,862,311 A | 8/1989 | Rust et al. | |
| 5,077,630 A | 12/1991 | Bina | |
| 5,142,434 A | 8/1992 | Boy et al. | |
| 5,555,150 A | 9/1996 | Newman, Jr. | |
| 5,923,519 A | * 7/1999 | Change et al. | 361/129 |
| 5,973,898 A | 10/1999 | Merchant et al. | |
| 6,351,011 B1 | * 2/2002 | Whitney et al. | 257/355 |
| 6,380,826 B1 | * 4/2002 | Palinkas | 333/175 |

* cited by examiner

*Primary Examiner*—Matthew Nguyen
(74) *Attorney, Agent, or Firm*—George R. McGuire; Hancock & Estabrook, LLP

(57) ABSTRACT

The present invention provides an over-voltage surge protection device comprising a printed circuit board having a signal carrying conductive member having a plurality of nodes positioned therealong, and a conductive member running to ground also having a plurality of nodes positioned therealong. The nodes on the signal carrying member and ground member extend along a common path with corresponding ones of the signal carrying nodes positioned in adjacent, but spaced relation to the ground nodes. Preferably, the nodes are shaped in the form of triangles due to this particular geometry's favorable ability to accumulate and discharge voltage.

21 Claims, 8 Drawing Sheets

(8X)

SPARK GAP DEVICE HAVING MULTIPLE NODES

BACKGROUND OF THE INVENTION

1. Field of Invention

The present invention generally relates to electrical surge protection devices, and more particularly to spark gaps formed on printed circuit boards.

2. Description of Prior Art

Broadband coaxial cable communications networks, such as CATV networks, include various types of electronic equipment mounted to outdoor utility poles. This electronic equipment is subjected to all types of weather conditions including, for example, lightening storms. Due to the importance of these communications networks to society, it is important that they be able to withstand the harsh conditions under which they operate.

On occasion, a high voltage surge may be transmitted through the coaxial cable to which the electronic components are interconnected, for instance, due to a lightning strike. If this high voltage surge is permitted to be picked up by the input or output pins of the interconnect device and transmitted to the electrical devices housed therein, the device would become inoperable due to the electrical components essentially melting or otherwise deteriorating as a consequence of the surge. A new connector would then need to be installed at the site of the surge.

In order to improve the reliability of the electronic components in a communications network, the interconnect units are generally equipped with some type of over-voltage surge protection device. IEEE Standard C62.41-1991 sets forth a recommended practice on surge voltages in low voltage power circuits. The surge protectors incorporated into the interconnect units may include, for instance, a single, conductive element positioned in adjacent, but spaced relation to the incoming signal. In the event of a transient, high voltage surge, the element will accumulate and discharge the over-voltage surge to ground prior to it passing through the electrical components. Incorporation of such surge protectors, however, add significantly to the complexity in manufacturing, and hence, the cost of an interconnect unit. In addition, if a voltage surge above what the protector is designed to handle is experienced by the connector unit, it will need to be replaced in any event.

3. Objects and Advantages

It is therefore a principal object and advantage of the present invention to provide an over-voltage surge protection device that is inexpensive to manufacture relative to the state of the art.

It is a further object and advantage of the present invention to provide an over-voltage surge protection device that can withstand multiple surges, hence increasing the life of the coaxial cable interconnect device.

Other objects and advantages of the present invention will in part be obvious, and in part appear hereinafter.

SUMMARY OF THE INVENTION

In accordance with the foregoing objects and advantages, the present invention provides an over-voltage surge protection device comprising a printed circuit board having a signal carrying conductive member having a plurality of nodes positioned therealong, and a conductive member running to ground also having a plurality of nodes positioned therealong. The nodes on the signal carrying member and ground member extend along a common path with corresponding ones of the signal carrying nodes positioned in adjacent, but spaced relation to the ground nodes. Preferably, the nodes are shaped in the form of triangles due to this particular geometry's favorable ability to accumulate and discharge voltage.

The over-voltage surge protection device may be fabricated directly into the board without mounting any additional structure thereto. A circuit board substrate that contains a layer of conductive material coated thereon may be fabricated by removing conductive material (e.g., by laser ablation, chemical or photolithographic etching, or other conventional fabrication process) in all areas on the board other than the signal carrying members and the conductive member leading to ground. The area of non-conductive material separating the signal carrying members from the ground member become the spark gaps.

The spacing between the nodes (and their shape) determine the voltage level at which a spark will generate and shunt the circuit. The number of nodes present in the device will determine how many over-voltage surges it will be able to withstand.

In operation, as the relative voltage potential between two corresponding nodes approaches a predetermined value, a spark will generate across the gap that separates them. This spark discharges the voltage from the signal carrying member to the grounded member, thereby shunting the circuit. Any particular spark may cause a deterioration of the particular node which discharges the surge. However, due to the circuit board having a plurality of corresponding sets of nodes, it will be able to withstand at least an equal number of over-voltage surges.

BRIEF DESCRIPTION OF THE DRAWING FIGURES

The present invention will be better understood and more fully appreciated by reading the following Detailed Description in conjunction with the accompanying drawings, wherein.

DETAILED DESCRIPTION

Figure 1:
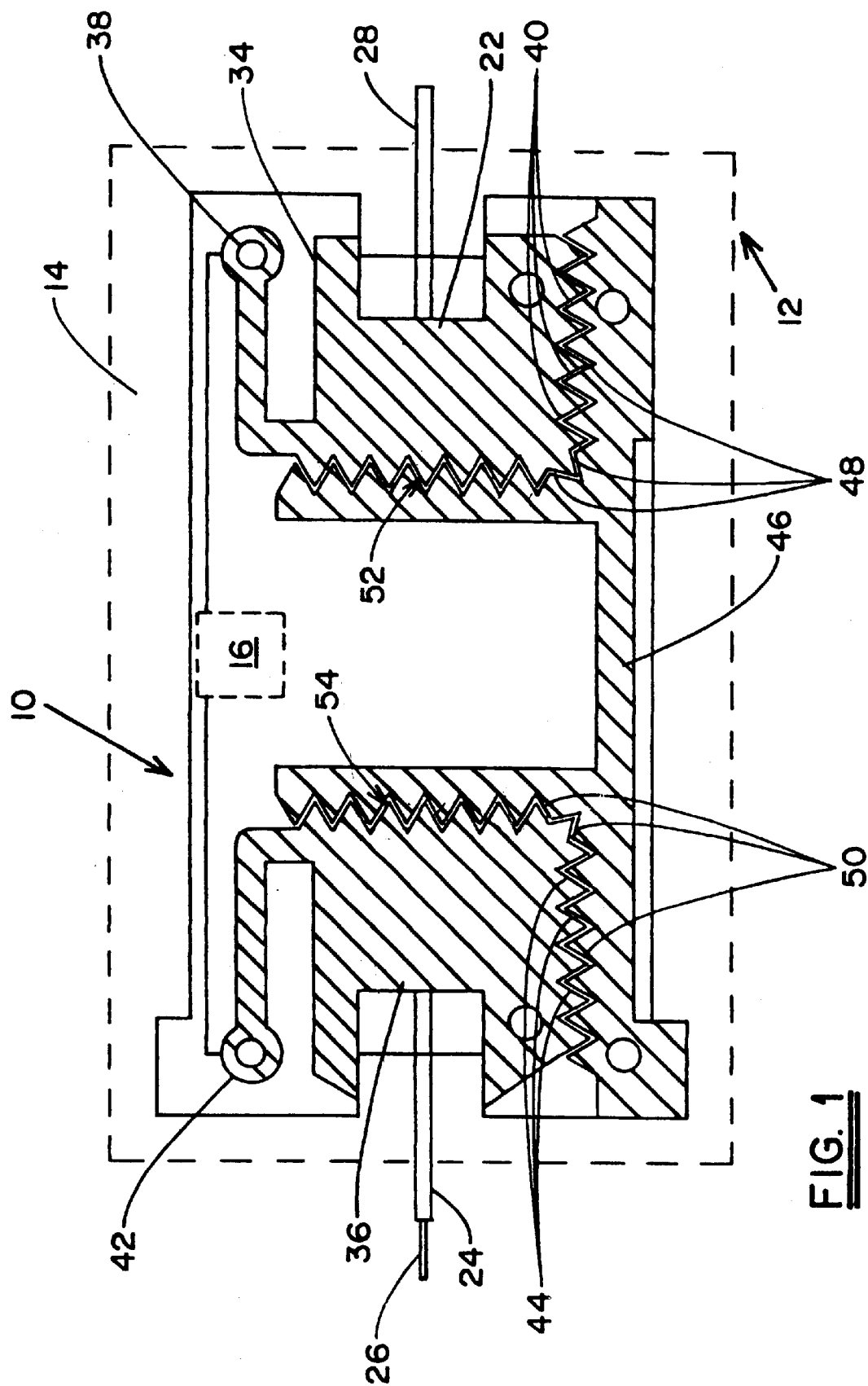
FIG. 1 is a plan view of a preferred embodiment of the present invention.

Referring now to the drawings, wherein like reference numerals refer to like parts throughout, there is seen in FIG. 1 a printed circuit board, designated generally by reference numeral 10, for use in a coaxial cable interconnect device, shown generally by reference numeral 12. Circuit board 10 is composed of a non-conductive substrate (e.g., a ceramic substrate of fiberglass) having a layer of conductive material, such as copper, coated on one planar surface 14 thereof. A series of electrical components, shown generally by reference numeral 16, are mounted in a conventional manner to either planar surface of board 10.

Interconnect device 12 serves, for instance, as a trap with electrical components 16 comprising a filter having a narrow pass band response within a predetermined frequency range (e.g. 5–40 MHz) with a fixed level of attenuation across the return path frequency spectrum. Such devices are commonly used in CATV networks.

Figure 3:
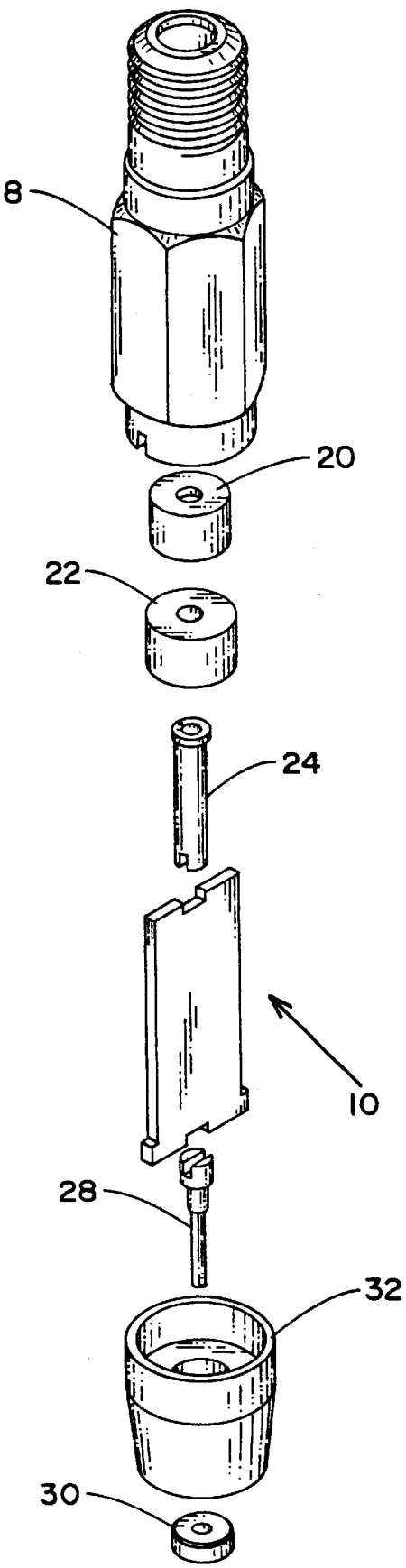
FIG. 3 is an exploded perspective of an interconnect device in which the present invention is used.
Figure 4:
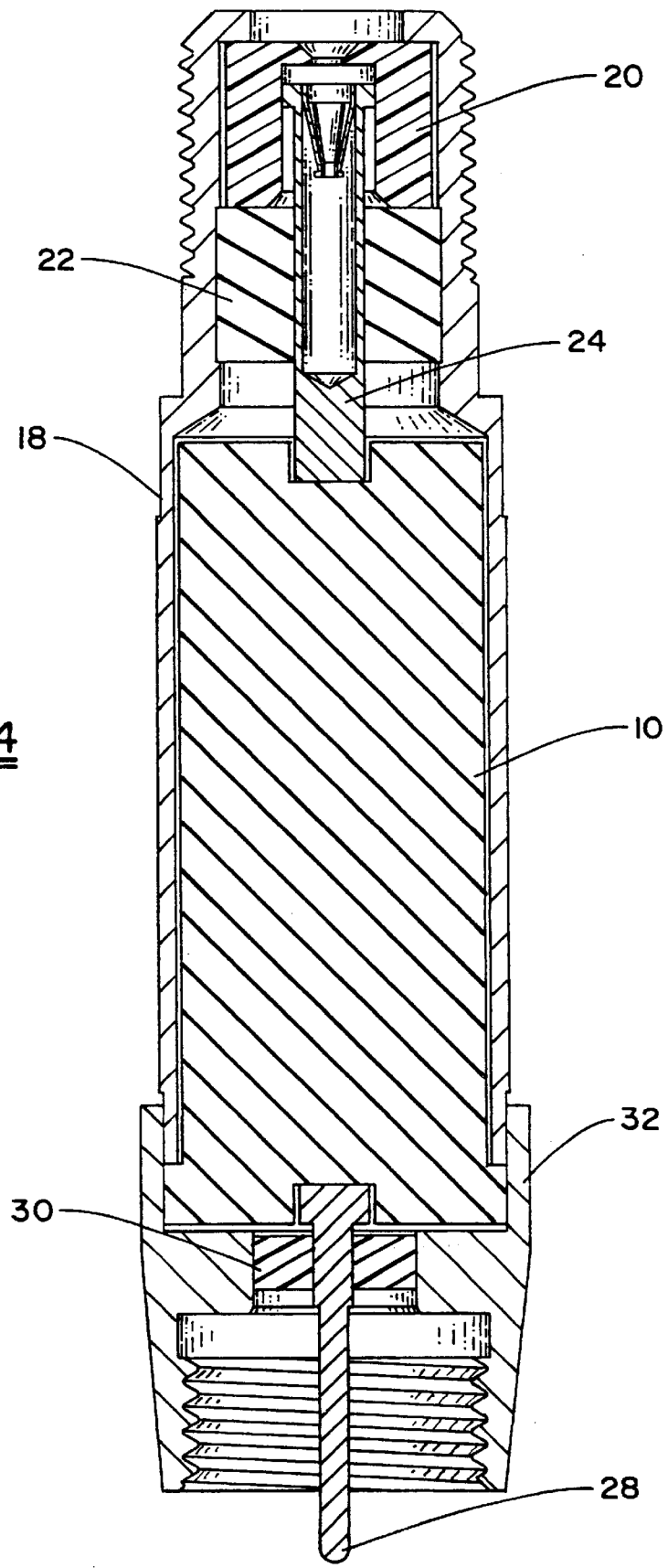
FIG. 4 is a longitudinal cross-sectional view of the interconnect device illustrated in FIG. 3.

Referring specifically to FIGS. 3 and 4, interconnect device 12 includes an elongated main body 18; a rear insulator 20 mounted concentrically within body 18 and positioned adjacent the terminal end thereof; a non-conductive (e.g., rubber) seal 22 positioned adjacent insulator 20; conductive female pin assembly 24 (which receives conductive pin 26 therein) concentrically extending through insulator 20 and seal 22; board 10 being electrically connected at one edge to pin assembly 24; a conductive, input pin 28 electrically connected to and extending outwardly from the opposing edge of board 10; a front insulator 30 positioned concentrically around pin 28; and a nut 32 threadingly engaging body 18 and housing insulator 30. Conductive, input pin 28 receives a signal being transmitted through a coaxial cable (as part of a communications network), and conductive, output pin 26 sends the signal towards its destination after having been conditioned by electrical components 16 mounted on board 10.

Figure 2:
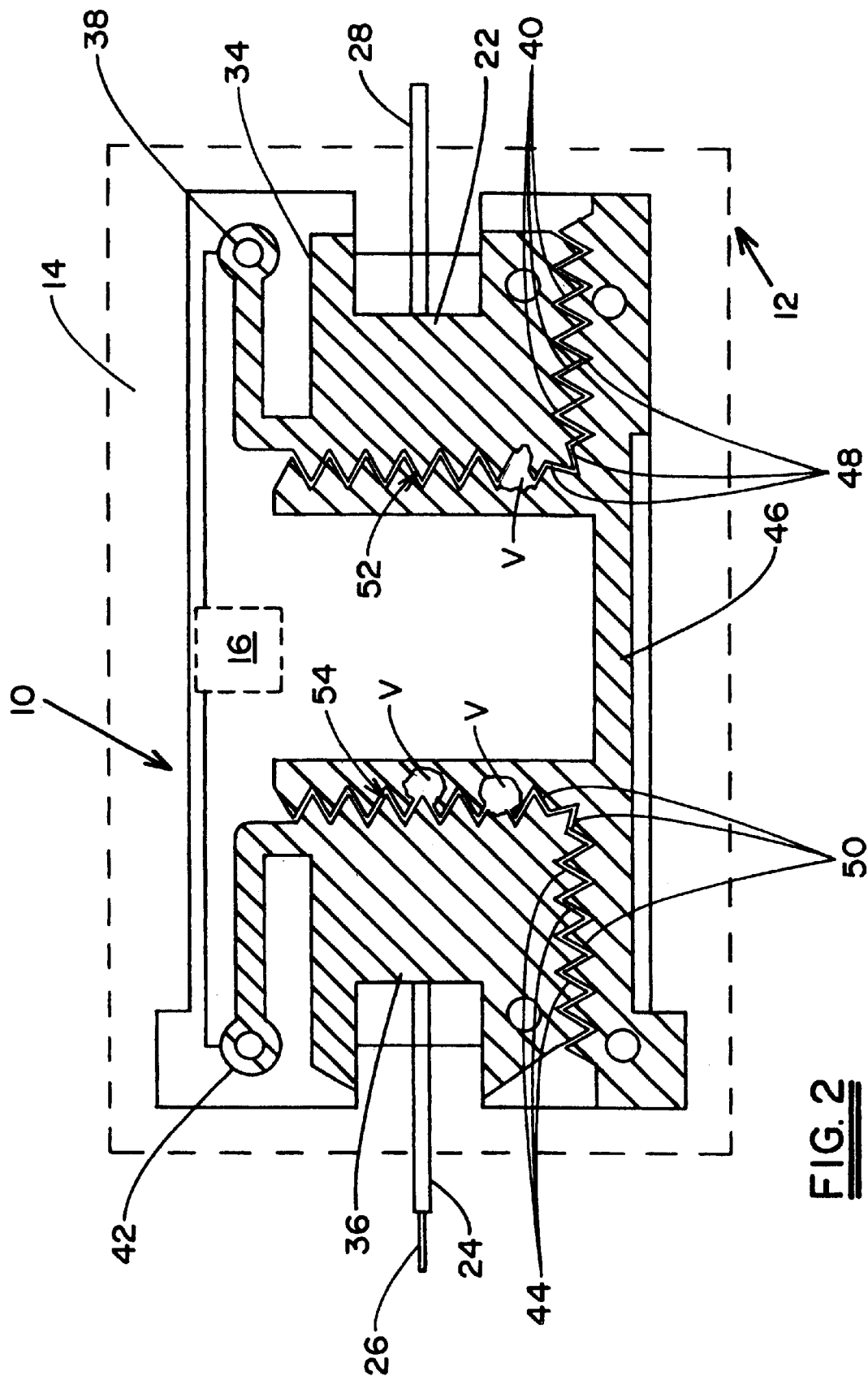
FIG. 2 is a plan view of the present invention after it has been exposed to an over-voltage surge.
Figure 5:
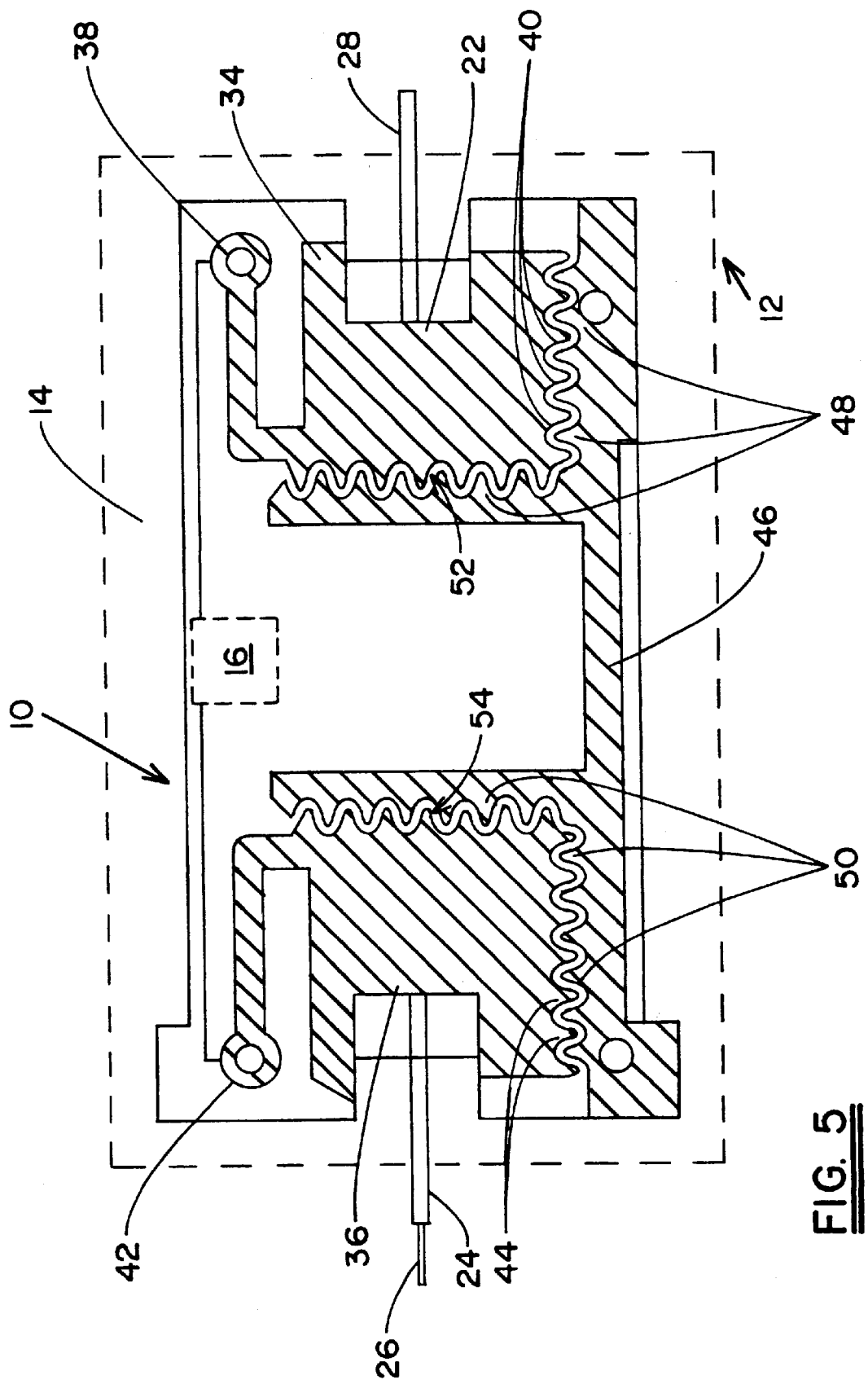
FIG. 5 is a plan view of a second alternate embodiment of the present invention.

Referring specifically to FIGS. 1, 2, and 5, board 10 includes electrical components 16 mounted on surface 14, a signal carrying, input member 34 electrically connected to pin 28, and a signal carrying, output member 36 electrically connected to pin assembly 24 signal carrying members 34 and 36 are preferably mounted on the other side thereof (although these elements could be mounted on the same side as electrical components 16, it is more space efficient to mount them on opposing sides and electrically interconnect there with vias). Signal carrying, input member 34 comprises electrically conductive material extending from pin 28 to a terminal node 38, and includes a plurality of nodes 40 positioned between pin 28 and terminal node 38. Output member 36 comprises an electrically conductive material extending from an terminal node 42 to pin assembly 24, and a plurality of nodes 44 positioned between node 42 and pin assembly 24. Nodes 40 and 44 are preferably triangular in shape (FIGS. 1 and 2), but may be shaped in other geometries, as well.

Terminal node 38 is electrically connected to electrical components 16 which are, in turn, electrically connected to the output terminal node 42. Thus, when the low voltage signal (e.g., device 12 generally operates on a circuit that passes 100 volts AC, with an RF level typically between +10 and −10 dBm) is received through pin 28, the signal is transmitted through input member 34 to electrical components 16. Electrical components 16 then appropriately condition (e.g. filter) the signal and send it through output member 36. The signal is then sent towards its 40 final destination via output pin 26.

An electrically conductive ground member 46 is also mounted on board 10. Member 46 includes a first plurality of nodes 48 which correspond in shape and number to nodes 40, and a second plurality of nodes 50 which correspond in shape and number to nodes 44. Nodes 48 are positioned in adjacent, but spaced relation to corresponding ones of nodes 40, thereby forming a first plurality of arc gaps 52 (each arc gap 52 defined by corresponding ones of nodes 40 and 48).

Nodes 50 are positioned in adjacent, but spaced relation to corresponding ones of nodes 44, thereby forming a second plurality of arc gaps 54 (each arc gap 54 defined by corresponding ones of nodes 44 and 50).

The arc gaps 52 and 54 separating nodes 48 from nodes 40, and nodes 50 from nodes 44, respectively, are composed of non-conductive material and are of generally uniform thickness. If a transient surge of high voltage (e.g., as a consequence of a lightening strike) is received by either pin 28 or pin 26, the voltage will travel to nodes 40 and 44, respectively, at which point a spark will generate and arc across gaps 52 and 54, respectively. The high voltage surge will then be grounded by member 46, thereby shunting the circuit and protecting electrical components 16 therefrom. If the high voltage surge is not shunted, electrical components 16 will be destroyed through the heat generated by the surge. Consequently, it is essential to the long term reliability of interconnect device 12 that it contain the over-voltage surge protection capabilities embodied by spark gaps 52 and 54.

Spark gaps 52 and 54 are preferably between 1 and 10 mils thick. Obviously, the smaller the spark gap distance, the lower the voltage level that will generate a spark.

If a transient high voltage surge does come through pins 28 or 26 and a spark does generate across nodes 40, 48 or 44, 50, it is possible that a portion of the nodes 48, 50 will deteriorate and vaporize, as illustrated in FIG. 2 by reference letters V. However, even if portions of nodes 48, 50 do deteriorate, the remainder of the plurality of nodes 48, 50 remain intact. Accordingly, spark gaps 52 and 54 provide an over-voltage surge protection device that can withstand numerous over-voltage surges.

Figure 6:
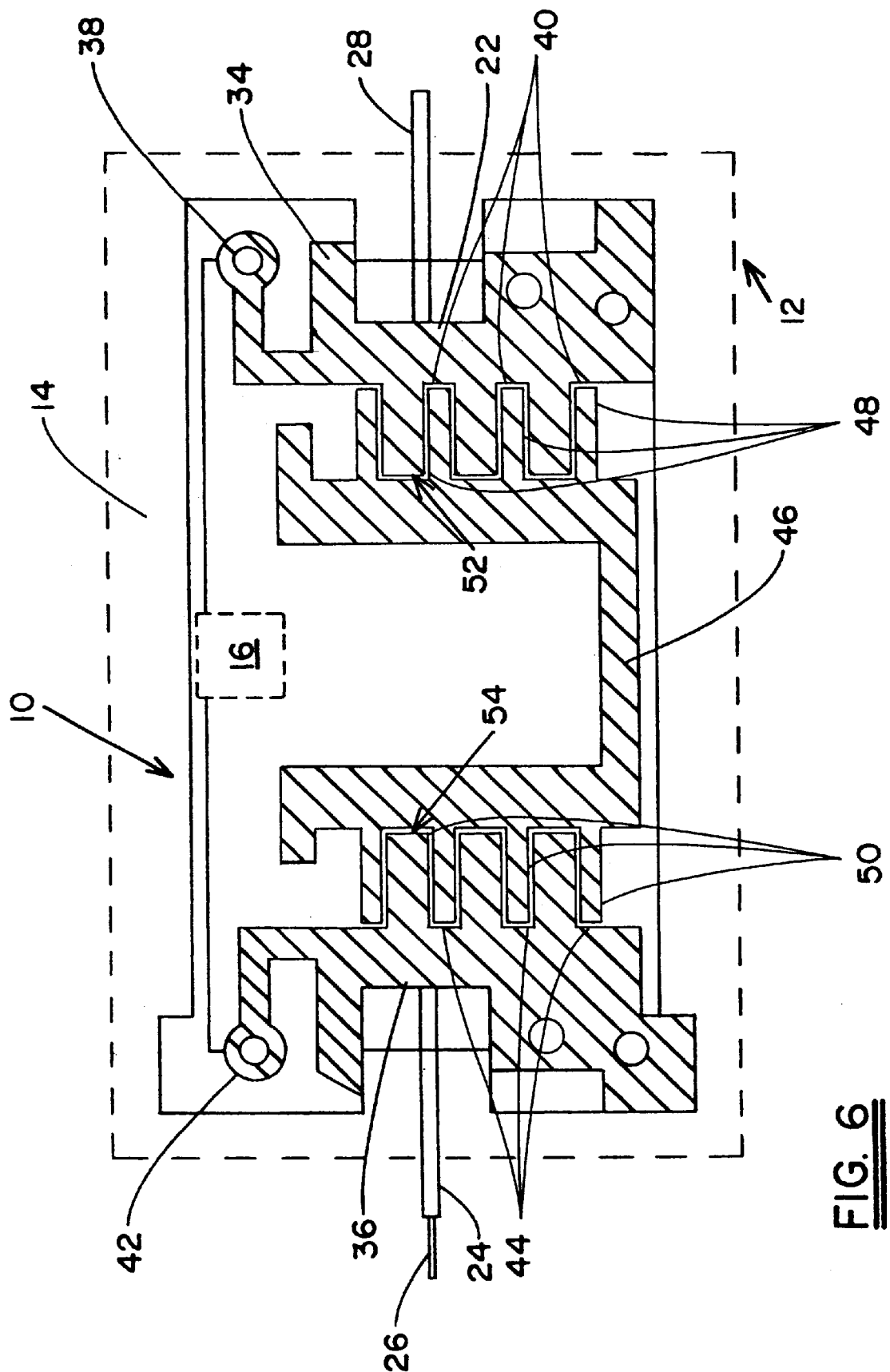
FIG. 6 is a plan view of a third alternate embodiment of the present invention.
Figure 7:
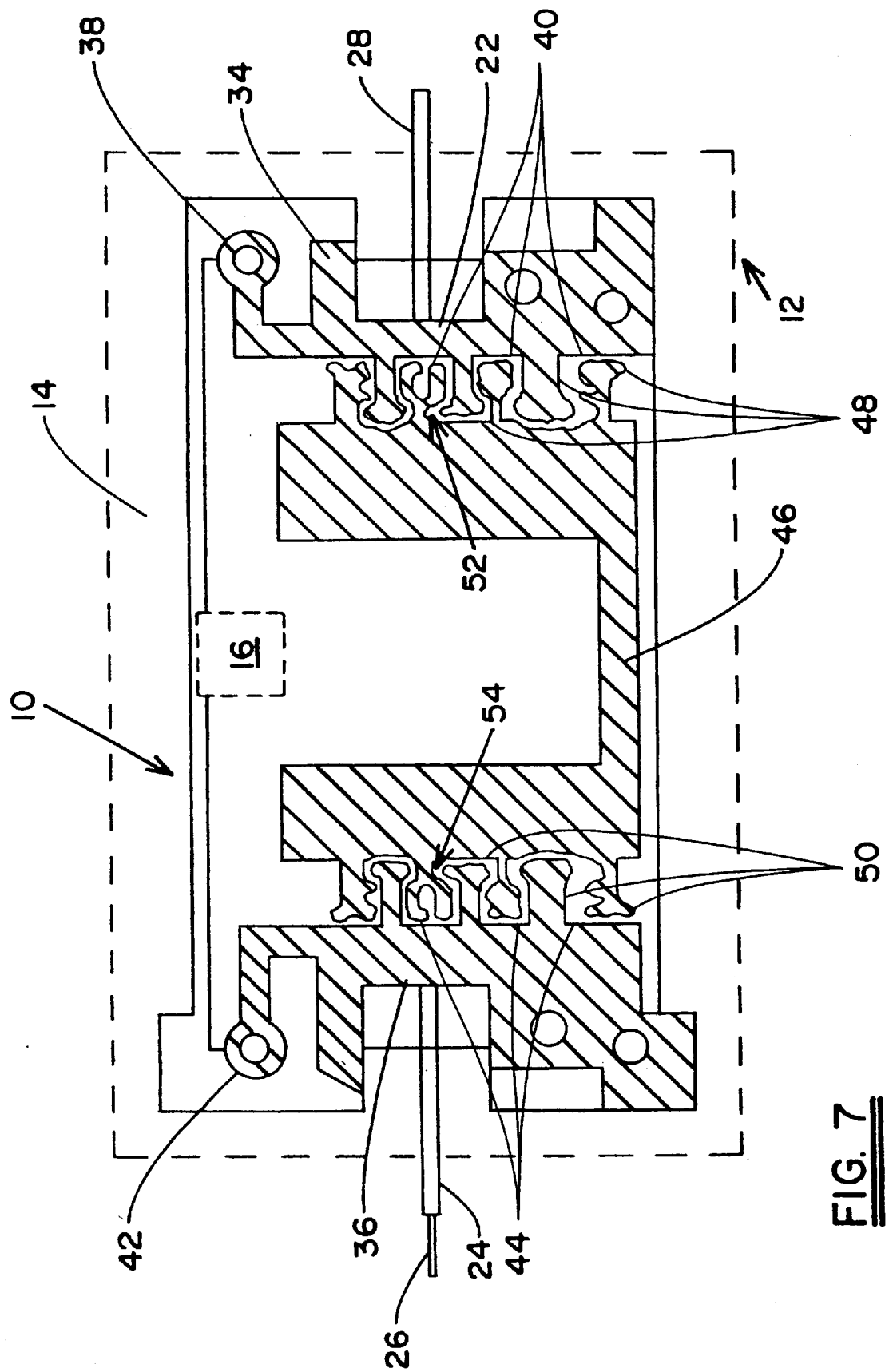
FIG. 7 is a plan view of a fourth alternate embodiment of the present invention.
Figure 8:
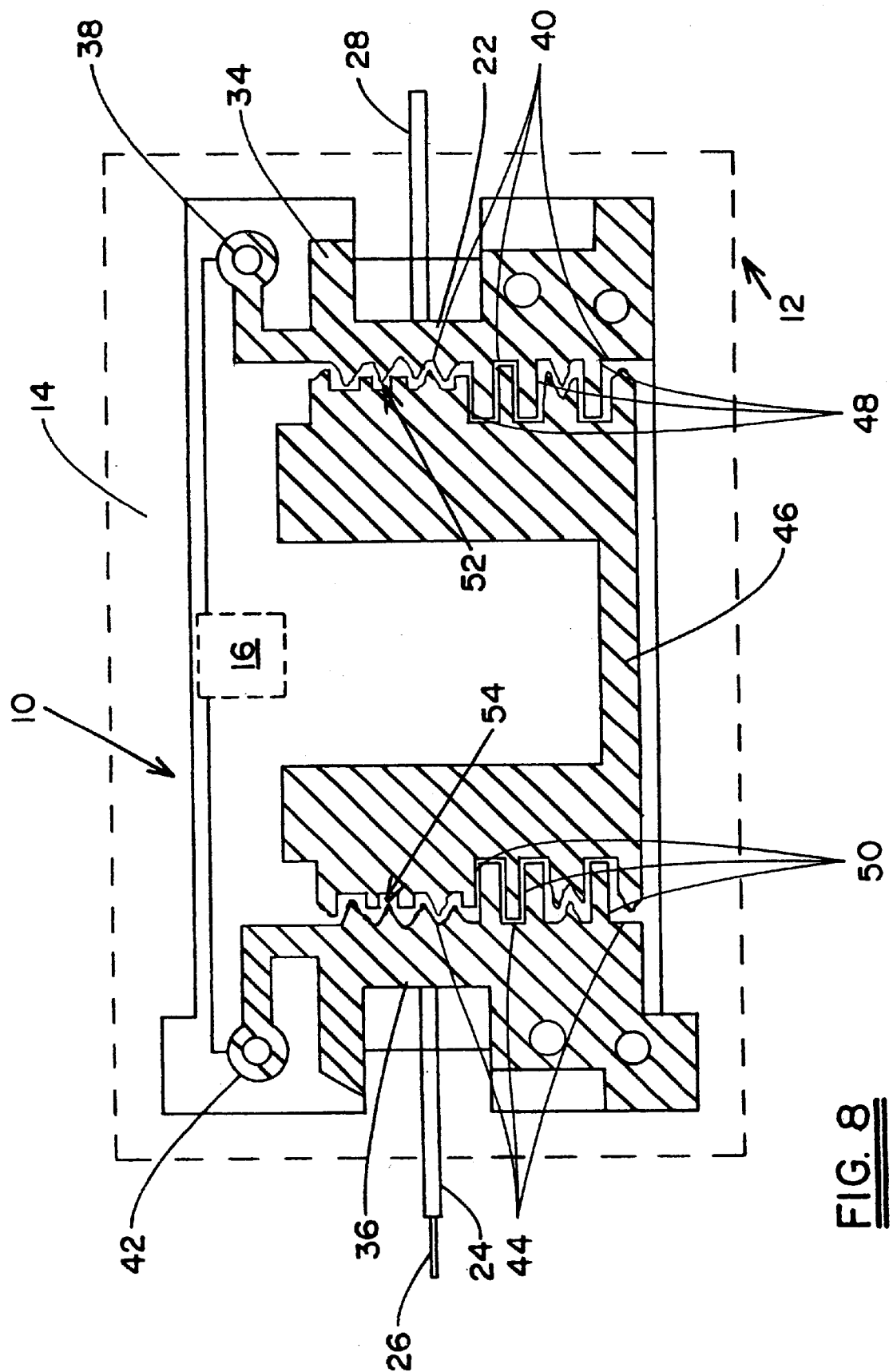
FIG. 8 is a plan view of a fifth alternate embodiment of the present invention.

Nodes 40, 48, 44 and 50 are preferably triangular in shape (as illustrated in FIGS. 1 and 2) as this geometry appears to most effectively accumulate and discharge voltages. However, these nodes could be shaped in other patterns so long as the spacing between corresponding nodes is small enough to maintain the efficiency spark gaps 52, 54 (e.g., the spacing can be variable, but preferably within the range of 1 to 10 Mils). For instance, corresponding nodes could be shaped sinusoidally rectangularly shaped (see FIG. 6), arbitrarily shaped (See FIG. 7), or rectangularly shaped with triangularly shaped corresponding nodes (see FIG. 8).

In forming spark gaps 52, 54, board 10 is provided with a coating of conductive material on one of its planar surfaces. Conductive material is then removed through any conventional process (e.g., laser ablation, photolithographic or chemical etching, or the like) from the areas of board 10 that are to be non-conductive, i.e., all areas other than input member 34, output member 36, and ground member 46. Forming spark gaps 52, 54 in this manner causes them to be coplanar with board 10, thereby using minimal space and not requiring the mounting of any additional structure to board 10.

What is claimed is:

1. An electrical surge protection device, comprising:
   a. a circuit board having a surface on which an electrical circuit is mounted;
   b. a signal carrying conductive member mounted to said circuit board and having an input end, a terminal end, and a first plurality of nodes positioned between said input end and said terminal end;
   c. a grounded conductive member mounted to said circuit board, and having a second plurality of nodes adjacently positioned in spaced relation to corresponding ones of said first plurality of nodes, thereby forming a spark gap in the space between said first and second plurality of nodes; and d. said spark gap being composed of non-conductive material.

2. The electrical surge protection device of claim 1, wherein said first and second plurality of nodes are triangularly shaped.

3. The electrical surge protection device of claim 1, wherein said first and second plurality of nodes are sinusoidally shaped.

4. The electrical surge protection device of claim 1, wherein said first plurality of nodes are rectangularly shaped and said second plurality of nodes are triangularly shaped.

5. The electrical surge protection device of claim 1, wherein said first plurality of spark gaps extend in a common plane with said surface of said board.

6. The electrical surge protection device of claim 1, further comprising a second, signal carrying member mounted to said circuit board and having an output end, a terminal end, and a third plurality of nodes positioned between said input end and said terminal end.

7. The electrical surge protection device of claim 6, wherein said grounded conductive member includes a fourth plurality of nodes that are adjacently positioned in spaced relation to said third plurality of nodes, thereby forming a second plurality of spark gaps in the spaces between corresponding ones of said third and fourth plurality of nodes.

8. The electrical surge protection device of claim 7, wherein said third and fourth plurality of nodes are triangularly shaped.

9. The electrical surge protection device of claim 7, wherein said third and fourth plurality of nodes are sinusoidally shaped.

10. The electrical surge protection device of claim 7, wherein said plurality of nodes are rectangularly shaped and said fourth plurality of nodes are triangularly shaped.

11. A coaxial cable interconnect device for filtering an electrical signal, comprising:
   a. a main body;
   b. a printed circuit board having a surface on which an electrical circuit is mounted, and further comprising:
     i. a first, signal carrying conductive member mounted to said circuit board and having an input end, a terminal end, and a first plurality of nodes positioned between said input end and said terminal end;
     ii. a grounded conductive member mounted to said circuit board, and having a second plurality of nodes adjacently positioned in spaced relation to corresponding ones of said first plurality of nodes, thereby forming a first plurality of spark gaps in the spaces between corresponding ones of said first and second plurality of nodes; and
     iii. said spark gap being composed of non-conductive material; and
   c. a conductive, input pin connected to said first, signal carrying member.

12. The interconnect device of claim 11, further comprising a second, signal carrying member mounted to said circuit board and having an output end, a terminal end, and a third plurality of nodes positioned between said input end and said terminal end.

13. The interconnect device of claim 12, wherein said grounded conductive member includes a fourth plurality of nodes that are adjacently positioned in spaced relation to said third plurality of nodes, thereby forming a second plurality of spark gaps in the spaces between corresponding ones of said third and fourth plurality of nodes.

14. The interconnect device of claim 13, wherein said third and fourth plurality of nodes are triangularly shaped.

15. The interconnect device of claim 13, wherein said third and fourth plurality of nodes are sinusoidally shaped.

16. The interconnect device of claim 13, wherein said third plurality of nodes are rectangularly shaped and said fourth plurality of nodes are triangularly shaped.

17. The interconnect device of claim 13, wherein said second plurality of spark gaps extend in a common plane with said surface of said board.

18. The interconnect device of claim 11, wherein said first and second plurality of nodes are triangularly shaped.

19. The interconnect device of claim 11, wherein said first and second plurality of nodes are sinusoidally shaped.

20. The interconnect device of claim 11, wherein said first plurality of nodes are rectangularly shaped and said second plurality of nodes are triangularly shaped.

21. The interconnect device of claim 11, wherein said first plurality of spark gaps extend in a common plane with said surface of said board.

* * * * *